US 7,259,441 B2

(12) United States Patent  (10) Patent No.: US 7,259,441 B2
Pamler et al.  (45) Date of Patent: Aug. 21, 2007

(54) HOLLOW STRUCTURE IN AN INTEGRATED CIRCUIT AND METHOD FOR PRODUCING SUCH A HOLLOW STRUCTURE IN AN INTEGRATED CIRCUIT

(75) Inventors: Werner Pamler, München (DE); Siegfried Schwarzl, Neubiberg (DE); Zvonimir Gabric, Zorneding (DE)

(73) Assignee: Infineon Technologies AG (DE)

( * ) Notice: Subject to any disclaimer, the term of this patent is extended or adjusted under 35 U.S.C. 154(b) by 0 days.

(21) Appl. No.: 10/469,279

(22) PCT Filed: Feb. 15, 2002

(86) PCT No.: PCT/DE02/00554

§ 371 (c)(1),
(2), (4) Date: Nov. 17, 2003

(87) PCT Pub. No.: WO02/071482

PCT Pub. Date: Sep. 12, 2002

(65) Prior Publication Data

US 2004/0084749 A1  May 6, 2004

(30) Foreign Application Priority Data

Mar. 1, 2001  (DE) ................................ 101 09 778

(51) Int. Cl.
*H01L 29/00*  (2006.01)
(52) U.S. Cl. ...................... 257/508; 257/210; 257/211; 257/503
(58) Field of Classification Search ................. 257/522, 257/619, E23.013, E21.564, 758; 438/619, 438/456, 421–422, 411–412

See application file for complete search history.

(56) References Cited

U.S. PATENT DOCUMENTS 5,098,856 A  *  3/1992  Beyer et al. ................. 438/422

(Continued)

FOREIGN PATENT DOCUMENTS

JP  8-37187  2/1996

OTHER PUBLICATIONS

Patent Abstracts of Japan, vol. 1997, No. 06, & JP 09 055431 A (Nippon Steel Corp.), Feb. 25, 1997 (abstract only).

(Continued)

*Primary Examiner*—Wai-Sing Louie
(74) *Attorney, Agent, or Firm*—Altera Law Group, LLC

(57) ABSTRACT

A pattern of voids in an integrated circuit having a first layer, a first layer surface and adjacent lands on the first layer surface, the adjacent lands enclosing spaces and including a second layer of a first isolation material and a third layer of a second isolation material arranged on the second layer. The pattern of voids has a fourth layer of a third isolation material which closes off at least some of the spaces and cannot be deposited on the first isolation material. The fourth layer is arranged on the third layer and has a second layer surface. Spaces that are not closed off by means of the fourth layer are filled with electrically conductive material. In the method for producing a pattern of voids in an integrated circuit, a second layer of a first isolation material is applied to a first layer surface of a first layer. A third layer of a second isolation material is applied to the second layer, the third layer acquiring a second layer surface which is arranged parallel to the first layer surface. Adjacent lands with spaces are formed from the second layer and the third layer. A third isolation material is selectively applied on the adjacent lands to the third layer, such that a fourth layer is formed between and above the adjacent lands. Parallel to the first layer surface, the fourth layer is partially removed until the second layer surface is uncovered. The fourth layer is completely removed above some spaces, and finally these spaces are filled with electrically conductive material in order to form electrical contacts between the first layer surface and the second layer surface, resulting in a pattern of voids.

9 Claims, 7 Drawing Sheets

U.S. PATENT DOCUMENTS

| | | | |
|---|---|---|---|
| 5,407,860 A | 4/1995 | Stoltz et al. | |
| 5,512,775 A | 4/1996 | Cho | |
| 5,539,243 A | 7/1996 | Matsuki | |
| 5,792,706 A * | 8/1998 | Michael et al. | 438/626 |
| 5,936,295 A * | 8/1999 | Havemann et al. | 257/522 |
| 5,949,143 A * | 9/1999 | Bang | 257/758 |
| 5,990,557 A | 11/1999 | Avanzino et al. | |
| 6,071,805 A * | 6/2000 | Liu | 438/619 |
| 6,091,149 A * | 7/2000 | Hause et al. | 257/758 |
| 6,177,329 B1 * | 1/2001 | Pang | 438/400 |
| 6,184,121 B1 * | 2/2001 | Buchwalter et al. | 438/622 |
| 6,211,057 B1 * | 4/2001 | Lin et al. | 438/619 |
| 6,211,561 B1 * | 4/2001 | Zhao | 257/522 |
| 6,228,770 B1 * | 5/2001 | Pradeep et al. | 438/692 |
| 6,268,262 B1 * | 7/2001 | Loboda | 438/422 |
| 6,355,551 B1 * | 3/2002 | Reinberg | 438/619 |
| 6,388,328 B1 * | 5/2002 | Doyle et al. | 257/758 |
| 6,396,146 B2 * | 5/2002 | Nakayama | 257/758 |
| 6,403,461 B1 * | 6/2002 | Tae et al. | 438/619 |
| 6,413,852 B1 * | 7/2002 | Grill et al. | 438/619 |
| 6,440,839 B1 * | 8/2002 | Partovi et al. | 438/619 |
| 6,465,339 B2 * | 10/2002 | Brankner et al. | 438/622 |
| 6,472,719 B1 * | 10/2002 | Lin et al. | 257/522 |
| 6,506,678 B1 * | 1/2003 | Sukharev | 438/688 |
| 6,545,361 B2 * | 4/2003 | Ueda et al. | 257/758 |
| 6,576,976 B2 * | 6/2003 | Lien et al. | 257/522 |
| 6,737,725 B2 * | 5/2004 | Grill et al. | 257/522 |
| 2003/0176055 A1 * | 9/2003 | Wu | 438/618 |

OTHER PUBLICATIONS

"A Novel Air Gap Integration Scheme for Multi-level Interconnects using Self-aligned Via Plugs", 1998 Symposium on VLSI Technology Digest of Technical Papers, pp. 46-47.
XP-000973380, "Lowering of Intralevel Capacitance Using Air Gap Structures", J.G. Fleming, et al., Conference Proceedings ULSI XII. 1997 Materials Research Society, pp. 471-477.

* cited by examiner

HOLLOW STRUCTURE IN AN INTEGRATED CIRCUIT AND METHOD FOR PRODUCING SUCH A HOLLOW STRUCTURE IN AN INTEGRATED CIRCUIT

BACKGROUND OF THE INVENTION

1. Field of the Invention

The invention relates to a pattern of voids in an integrated circuit and to a method for producing a pattern of voids in an integrated circuit.

Integrated circuit arrangements are being produced with ever higher packing densities. This means that interconnects in metallization levels are at an ever increased shorter distance from one another. This causes capacitances which are formed between the interconnects and lead to high signal propagation times, high power loss and crosstalk. Hitherto, to provide isolation between the interconnects primarily $SiO_2$ has been used as a dielectric whose relative permittivity is $\epsilon_r=3.9$.

2. Description of the Related Prior Art

There are a number of known methods for reducing the relatively permittivity $\epsilon_r$ and therefore for lowering the capacitance between interconnects within an interconnect level, for example from [1] or [2].

According to the cited prior art, voids are produced between the interconnects within an interconnect level. The isolating dielectric, which determines the capacitance between the interconnects, therefore has a relative permittivity $\epsilon_r$ which is virtually equal to unity. The interconnects themselves are enclosed at the top and bottom by solid $SiO_2$ layers for isolation purposes.

BRIEF SUMMARY OF THE INVENTION

Since a not inconsiderable contribution to the overall capacitance between adjacent interconnects within a layer is also made by the capacitances of the isolating layers above and below them, and these isolating layers still consist of solid $SiO_2$ material, the high relative permittivity $\epsilon_r$ of these isolating layers has a considerable effect on the overall capacitance between the adjacent interconnects. The high relative permittivity $\epsilon_r$ of the isolating layers made from solid $SiO_2$ material in addition very particularly affects the capacitance of interconnects adjacent to one another in different layers.

The invention is therefore based on the problem of providing a pattern of voids in an integrated circuit and a method for producing a pattern of voids in an integrated circuit in which the isolating layer between interconnects from different levels has a low capacitance on account of a low relative permittivity $\epsilon_r$ as well as the option of forming contacts.

The problem is solved by a pattern of voids in an integrated circuit and by a method for producing a pattern of voids in an integrated circuit having the features given in the independent patent claims.

A pattern of voids according to the invention in an integrated circuit has a first layer, a first layer surface and adjacent lands on the first layer surface, the adjacent lands enclosing spaces and including a second layer of a first isolation material and a third layer of a second isolation material arranged on the second layer. Furthermore, the pattern of voids has a fourth layer of a third isolation material which closes off at least some of the spaces and cannot be deposited on the first isolation material. Furthermore, in the pattern of voids the fourth layer is arranged on the third layer. The fourth layer has a second layer surface. Finally, in the pattern of voids spaces which are not closed off by means of the fourth layer are filled with electrically conductive material.

In the case of a method for producing a pattern of voids in an integrated circuit, a second layer of a first isolation material is applied to a first layer surface of a first layer. A third layer of a second isolation material is applied to the second layer, the third layer acquiring a second layer surface which is arranged parallel to the first layer surface. Adjacent lands with spaces are formed from the second layer and the third layer. A third isolation material is selectively applied on the adjacent lands to the third layer, with the result that a fourth layer is formed between and above the adjacent lands. Parallel to the first layer surface, the fourth layer is partially removed until the second layer surface is uncovered. The fourth layer is completely removed above some spaces, and finally these spaces are filled with electrically conductive material in order to form electrical contacts between the first layer surface and the second layer surface, resulting in a pattern of voids.

One advantage of the invention can be considered to reside in the fact that, by using the pattern of voids as an isolating layer between adjacent interconnects, the relative permittivity $\epsilon_r$ of the isolating layer between the adjacent interconnects is virtually equal to unity, and therefore, the capacitance between these interconnects is reduced. The reduction in the capacitance effects both adjacent interconnects within a layer and interconnects arranged adjacently in different layers. Therefore, the pattern of voids allows the total capacitance within an integrated circuit to be reduced considerably.

A further advantage of the pattern of voids is the provision of contacts which are easy to produce between interconnects arranged in different layers. By means of the adjacent lands and in particular by means of the spaces enclosed by these lands, it is possible, for some of the spaces, for the fourth layer to be deliberately removed between adjacent lands, so that these spaces are opened up in order for the opened spaces then to be filled with electrically conductive material, so that contacts are produced between a layer below and a layer above the pattern of voids.

The spaces which are closed off preferably form voids between the adjacent lands, the first layer surface and the fourth layer. After the pattern of voids has been completed, these voids are filled with air and therefore have a relative permittivity $\epsilon_r$ of virtually one. Therefore, the capacitance effect of the pattern of voids is very slight.

In a preferred refinement of the pattern of voids according to the invention, the voids are provided for the purpose of electrical isolation between the first layer surface and the second layer surface. As an alternative to an isolating layer made from solid material between two so-called metallization levels, i.e. layers with one or more integrated interconnects and/or semiconductor components, it is now possible to use the pattern of voids, with the result that the capacitance between adjacent interconnects and/or semiconductor components from different metallization levels is considerably reduced and crosstalk between the signals carried in the interconnects and/or processed in the semiconductor components is reduced.

It is preferable for the first layer surface to be partially electrically conductive. The first layer may in this case, for example, be a substrate having one or more integrated semiconductor components. Alternatively, the first layer may also, for example, be a metallization level with one or more interconnects. The precise internal structure and also the condition of the first layer are of no relevance to the invention, provided that the first layer has a layer surface which preferably lies in one plane.

In a preferred refinement of the pattern of voids according to the invention, the spaces filled with electrically conductive material are provided as electrical contacts between the first layer surface and the second layer surface. In this case, the contacts are used for targeted electrical connection between individual interconnects and/or semiconductor components without destroying the isolating action of the pattern of voids with respect to the other interconnects/semiconductor components.

The voids belonging to the pattern of voids are preferably provided for the purpose of electrical isolation between contacts in different spaces. The electrical isolation between contacts is comparable to the electrical isolation between adjacent interconnects and serves to reduce the capacitance between different signal paths.

It is preferable for the adjacent lands to be arranged in grid form. This has the advantage that the shape of the spaces and therefore the shape or diameter of the electrical contacts can be predetermined. Furthermore, a grid arrangement offers the option of building up a stable pattern of voids while using little material for the lands yet nevertheless obtaining a relative permittivity $\epsilon_r$ with a value of virtually one.

The adjacent lands and spaces preferably form a planar pattern of voids with a planar second layer surface. Furthermore, a plurality of these planar patterns of voids can be arranged above one another. This has the advantage that overall it is possible to form a wide isolating layer with continuous contacts, yet this wide isolating layer, for stability purposes, comprises a plurality of differently constructed, planar patterns of voids.

In the case of a method according to the invention for producing a pattern of voids, the adjacent lands are preferably produced by means of lithography and etching. For this purpose, the second layer and the third layer are initially applied areally above one another over the first layer surface. Then, the pattern of adjacent lands is "written" both into the second layer and into the third layer by means of lithography and finally uncovered by means of etching. Using a suitable lithography mask, the pattern of adjacent lands and therefore the shape of the grid are predetermined.

In a preferred refinement of the method according to the invention, voids are formed between the adjacent lands, the first layer surface and the fourth layer by means of selective deposition of the third isolation material in the spaces. If the three isolation materials are selected appropriately, it is possible to ensure that the third isolation material accumulates selectively only at the second isolation material and not at the first isolation material. Consequently, the fourth layer appears to form a type of cover for the spaces located between the adjacent lands.

According to another clear description, the fourth layer, which has accumulated selectively at the third layer, together with the third layer and the second layer forms a mushroom-like structure. It is preferable to select the following materials for this purpose: silicon nitride ($Si_3N_4$) as first isolation material for the second layer, plasma-enhanced silicon dioxide ($SiO_2$) based on silane ($SiH_4$) as second isolation material for the third layer, and silicon dioxide ($SiO_2$) based on ozone-activated tetraethyl orthosilicate ($O_3$/TEOS) as third isolation material for the fourth layer. In this case, the plasma-enhanced silicon dioxide ($SiO_2$) based on silane ($SiH_4$) is usually deposited in a PECVD process (PECVD=plasma-enhanced chemical vapor deposition). Of course, it is also possible to select other electrically isolating materials if they have the above-described selectivity with regard to the way in which they are deposited.

In a preferred embodiment of the method according to the invention, the fourth layer is partially removed by means of chemical-mechanical polishing in order to uncover the third layer. Since the fourth layer is applied not only parallel but also vertically with respect to the first layer surface, i.e. also above the third layer, it is possible, by wearing down the fourth layer parallel to the first layer surface until the third layer is reached, to create a uniform planar second layer surface, to which further layers can be applied.

In the method according to the invention, to uncover some spaces it is preferable for the fourth layer to be removed above the spaces by means of lithography and etching, so that these spaces are opened up again. Prior chemical-mechanical polishing of the fourth layer is particularly advantageous in this respect, since this operation uncovers a surface of the third layer which is parallel to the first layer surface. In this way, the pattern of adjacent lands and consequently the positions of the spaces are made visible. By means of the removal of the fourth layer above some spaces, openings are formed in the pattern of voids, extending from the second layer surface to the first layer surface, so that they can then be filled with electrically conductive material in order to form contacts.

BRIEF DESCRIPTION OF THE DRAWINGS

An exemplary embodiment of the invention is illustrated in the figures and is explained in more detail below. In this context, identical reference symbols denote identical or equivalent components. In the drawing.

DETAILED DESCRIPTION OF THE INVENTION

Figure 1:
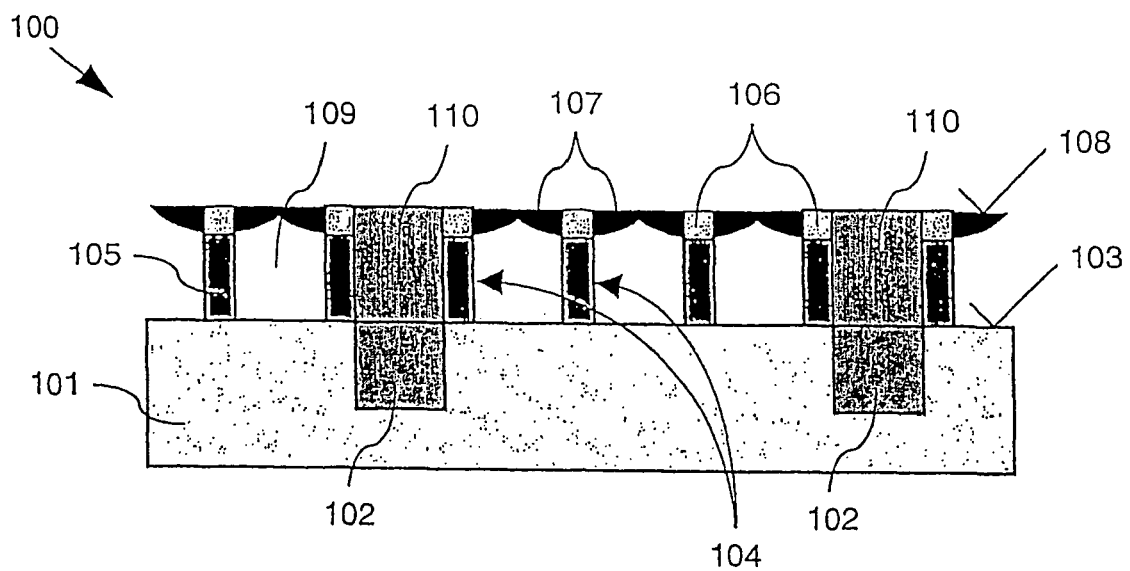
FIG. 1 shows a cross section through a pattern of voids in accordance with an exemplary embodiment of the invention.

FIG. 1 shows a cross section through a pattern of voids 100 in accordance with an exemplary embodiment of the invention.

The pattern of voids 100 has a substrate with integrated interconnects 102 and a substrate surface, which is formed as first layer surface 103, as first layer 101. The substrate material selected was an isolating material, preferably silicon dioxide ($SiO_2$). The first layer may alternatively also include a pattern of integrated interconnects with voids arranged between them within the first layer 101.

Adjacent lands 104 which include a second layer 105 and a third layer 106 are located on the first layer surface 103. In this exemplary embodiment, the adjacent lands 104 are arranged in grid form, in each case at a constant distance from one another and with square spaces between them of substantially the same size. The second layer 105 includes a first isolation material, according to the present exemplary embodiment silicon nitride ($Si_3N_4$).

The third layer 106 includes a second isolation material; according to this exemplary embodiment, plasma-enhanced (PECVD process) silicon dioxide ($SiO_2$) based on silane ($SiH_4$) is used.

A fourth layer 107 of a third isolation material, according to the present exemplary embodiment silicon dioxide ($SiO_2$) based on ozone-activated tetraethyl orthosilicate ($O_3$/TEOS), is located on the third layer 106 between the adjacent lands 104. An appropriate selection of isolation materials ensures that the fourth layer 107 is formed selectively only on the third layer 106. The fourth layer 107 and the third layer 106 have a common surface, which is referred to below as second layer surface 108 and is parallel to the first layer surface 103.

On account of the selective deposition of the fourth layer 107 on the third layer 106, voids 109 are enclosed between the first layer surface 103, the adjacent lands 104 and the fourth layer 107. Between some of the adjacent lands 104, the fourth layer 107 is removed again and the uncovered regions located between the adjacent lands 104 are filled with electrically conductive material in order to form electrical contacts 110.

Further metallization levels can be applied as desired above the second layer surface 108. The pattern of voids 100 according to the invention firstly offers both an increased isolating effect between the interconnects 102 by means of the arrangement of electrically isolating voids 109, which reduce the relative permittivity $\epsilon_r$ between the interconnects 102, and an increased isolating effect between the first layer surface 103 and the second layer surface 108. Secondly, the pattern of voids 100 according to the invention offers the option of deliberately providing electrical contacts 110 between the first layer surface 103 and the second layer surface 108.

The distance between two adjacent lands 104 and also the thickness of the adjacent lands 104 should be selected in such a way that the pattern of voids 100 according to the invention has a good ability to support further layers and metallization levels arranged above the second layer surface 108. According to the present exemplary embodiment, the adjacent lands 104 each have a thickness of 100 nm and are at a distance of 500 nm from one another.

On account of the selectivity of the third isolation material in terms of its deposition properties, the formation of the fourth layer 107 is comparable to the formation of beads at the upper ends of the adjacent lands 104. After a certain growth time, the beads of adjacent lands 104 overlap one another and form a continuous fourth layer 107. The fourth layer 107 is thinnest at the locations at which beads overlap. Since the fourth layer 104 is partially removed again in order to form the uniform second layer surface 108 parallel to the first layer surface 103, it must be ensured that the distance between the adjacent lands 104 is not selected to be too great, so that the fourth layer 107 does not break open again at the locations where the beads overlap.

Figure 2:
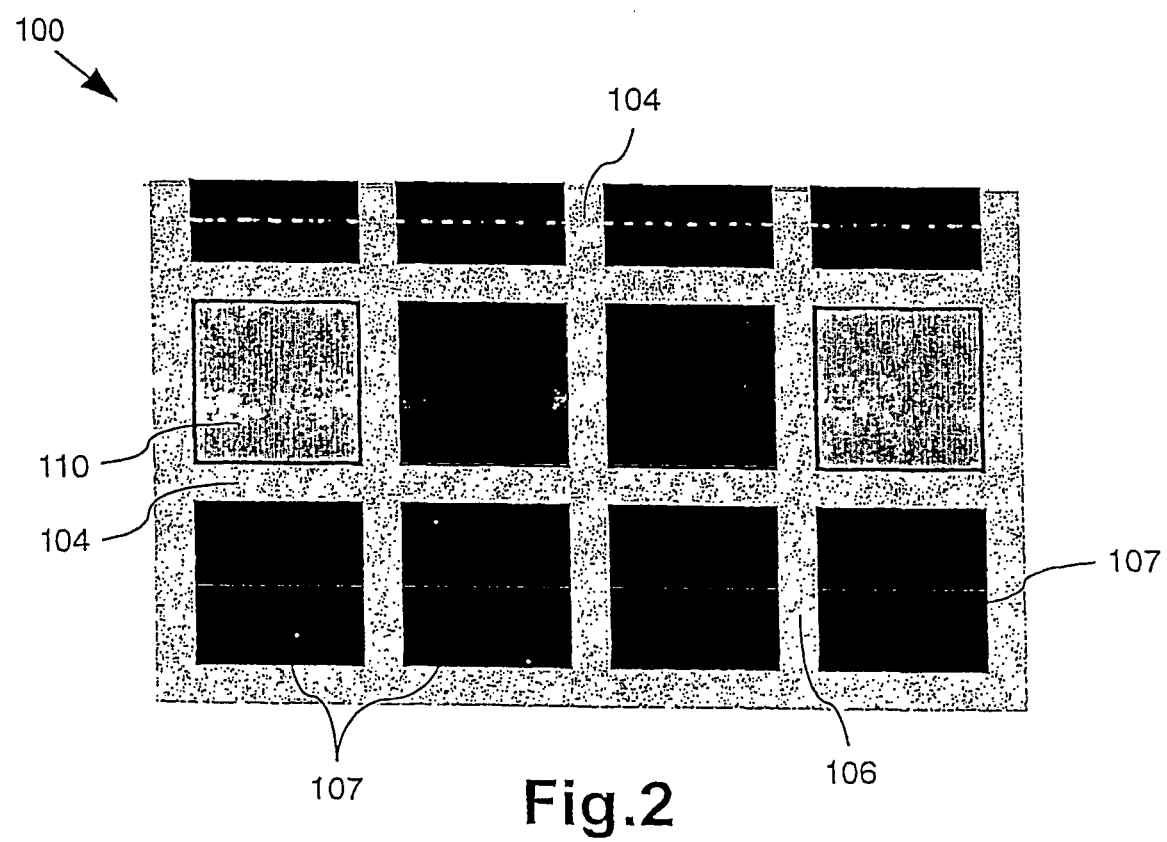
FIG. 2 shows a plan view of the pattern of voids from FIG. 1.

FIG. 2 shows a plan view of the pattern of voids 100 from FIG. 1. FIG. 2 illustrates the adjacent lands 104, which are in a square grid, with the third layer 106 visible at the second layer surface 108.

Most of the square spaces between the adjacent lands 104 are covered by means of the fourth layer 107 and enclose voids 109. However, some of the square spaces are filled with electrically conductive material and form contacts 110 between the first layer surface 103 and the second layer surface 108.

The shape of the grid which is formed by the adjacent lands 104 is arbitrary. It is equally possible to use grid shapes which form hexagonal spaces or spaces of other shapes between the adjacent lands 104.

The following text describes a method for forming the pattern of voids 100 according to the invention step by step.

Figure 3:
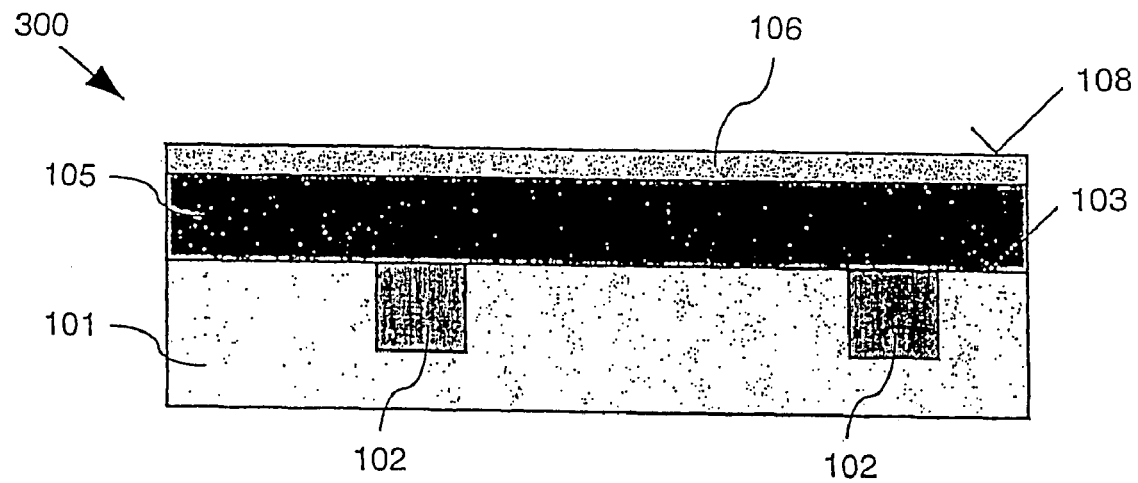
FIG. 3 shows a cross section through an as yet incomplete pattern of voids in accordance with FIG. 1 at a first time during the execution of the production method in accordance with the exemplary embodiment of the invention.

FIG. 3 shows a cross section through an as yet incomplete pattern of voids 300 at a first time during the execution of the production method according to the exemplary embodiment of the invention.

A substrate with integrated interconnects 102 and a substrate surface formed as first layer surface 103 is used as first layer 101. The substrate material is silicon dioxide ($SiO_2$).

A second layer 105 of silicon nitride ($Si_3N_4$) is applied areally to the first layer surface 103 by means of a standard process. A third layer 106 of silicon dioxide ($SiO_2$) is grown areally on the second layer 105 by means of a PECVD process based on silane ($SiH_4$). The third layer 106 ends with a second layer surface 108 parallel to the first layer surface 103.

The total thickness of the second layer 105 and the third layer 106 corresponds to the desired subsequent depth of the contacts 110 or can be matched to the requirements which are necessary to ensure a sufficient isolation strength. In this exemplary embodiment, the total thickness is 400 nm, with a thickness of 100 nm for the third layer 106.

Figure 4:
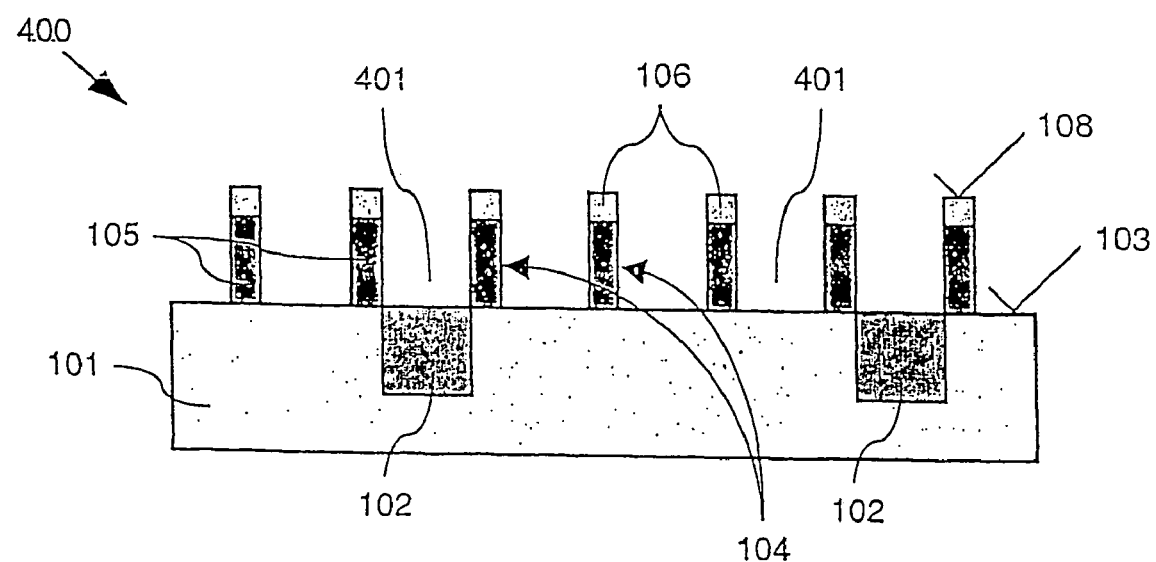
FIG. 4 shows a cross section through an as yet incomplete pattern of voids in accordance with FIG. 1 at a second time during the execution of the production method in accordance with the exemplary embodiment of the invention.

FIG. 4 shows a cross section through an as yet incomplete pattern of voids 400 at a second time during the execution of the production method in accordance with the exemplary embodiment of the invention.

A pattern in grid form, which includes adjacent lands 104 comprising the second layer 105 and the third layer 106, is formed by means of lithography and subsequent etching of the second layer 105 and the third layer 106. The adjacent lands 104 are each at identical distances from one another and enclose spaces 401. The spaces 401 extend as far as the first layer surface 103.

Figure 5:
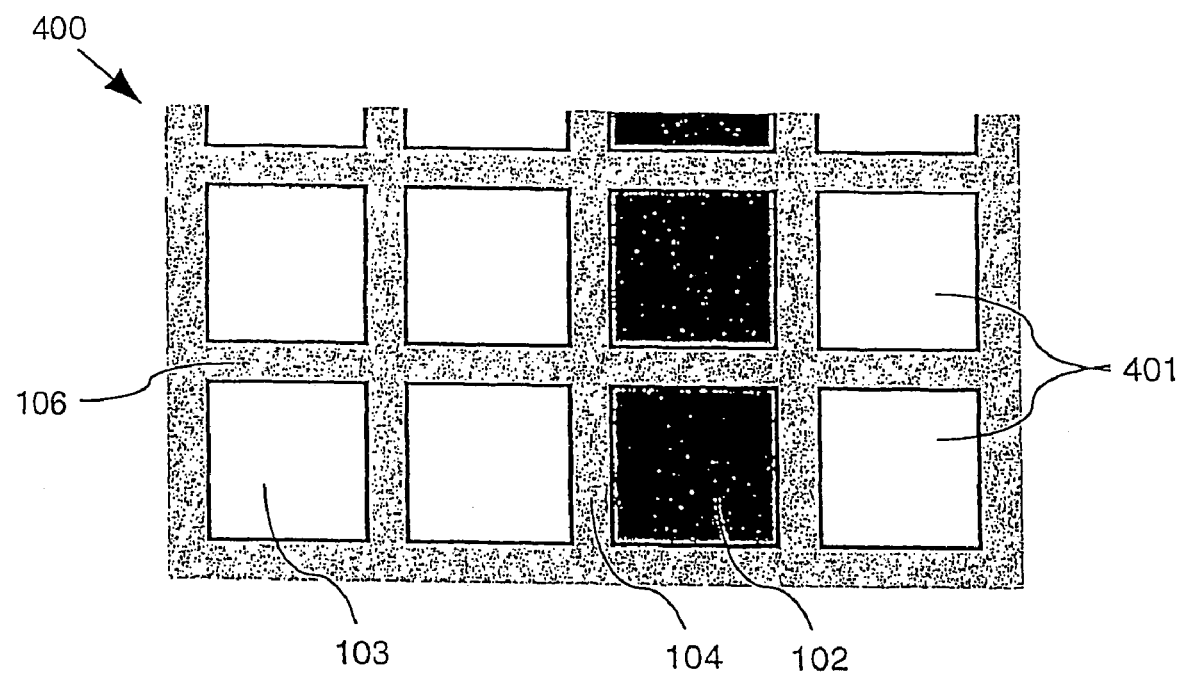
FIG. 5 shows a plan view of the pattern of voids from FIG. 4.

FIG. 5 shows a plan view of the pattern of voids 400 from FIG. 4. FIG. 5 shows the square shape of the spaces 401 between the adjacent lands 104. Since the spaces 401 extend as far as the first layer surface 103, the interconnect 102 below is uncovered in some spaces 401.

Figure 6:
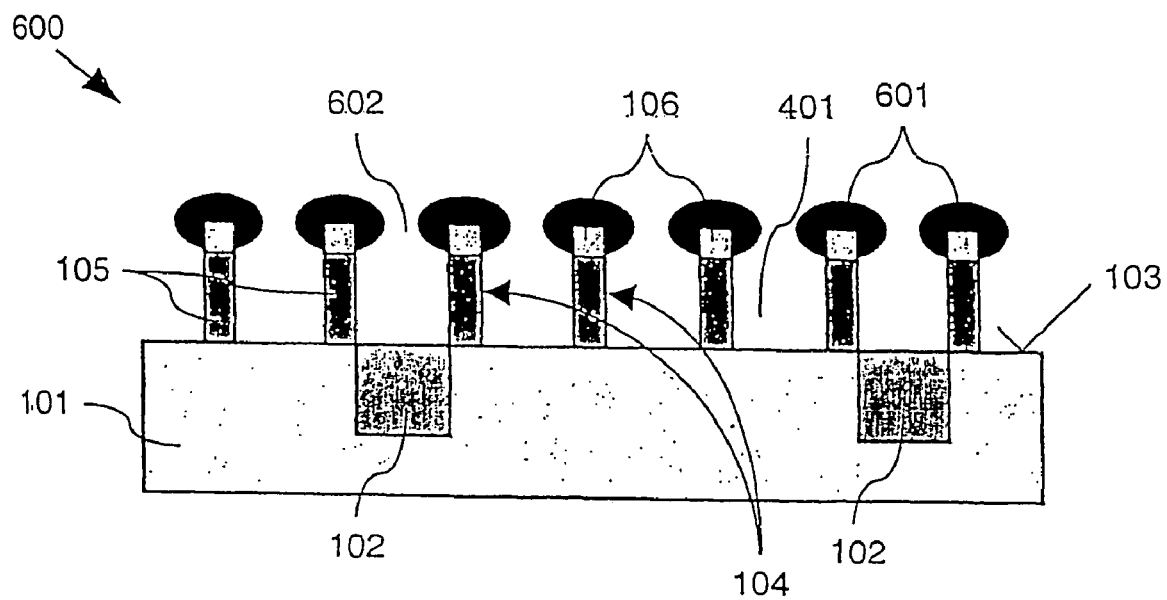
FIG. 6 shows a cross section through an as yet incomplete pattern of voids in accordance with FIG. 1 at a third time during the execution of the production method according to the exemplary embodiment of the invention.

FIG. 6 shows a cross section through an as yet incomplete pattern of voids 600 at a third time during the execution of the production method in accordance with the exemplary embodiment of the invention.

A third isolation material, which at the upper ends of the adjacent lands 104 forms beads 601, is applied selectively to the third layer 106 at the adjacent lands 104. At the upper ends of the adjacent lands 104, the beads 601 narrow the spaces 401 located between the lands, the spaces 401 having openings 602 in the vicinity of the third layer 106 which are gradually being closed up by growth.

The third isolation material used is silicon dioxide ($SiO_2$) which is based on ozone-activated tetraethyl orthosilicate ($O_3$/TEOS) and is deposited in a vacuum process. On account of the specific choice of the first isolation material ($Si_3N_4$) for the second layer 105 and of the second isolation material ($SiO_2$) for the third layer 106, and on account of the selected $O_3$/TEOS vacuum process, the third isolation material ($SiO_2$) is deposited selectively only on the third layer 106, in order to form the beads 601.

To form a pattern of voids 100 according to the invention, it is also possible to use other isolating materials and production processes instead of the three isolation materials selected and the processes used to produce them.

Figure 7:
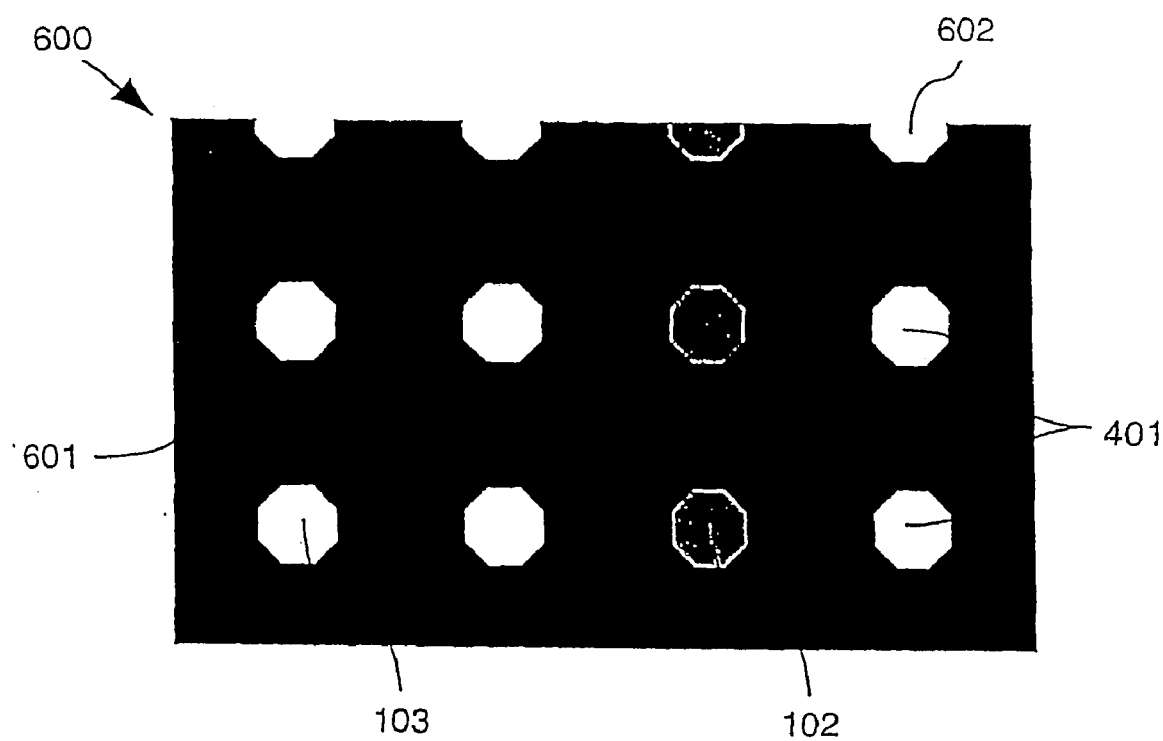
FIG. 7 shows a plan view of the pattern of voids from FIG. 6.

FIG. 7 shows a plan view of the pattern of voids 600 from FIG. 6. The third isolation material which has been deposited covers the adjacent lands 104 and therefore the third layer 106. As has already been described in connection with FIG. 6, beads 601, which, with openings 602 which are being closed up by growth, cover the spaces 401 step by step, are formed by means of the deposited third isolation material. The first layer surface 103 with the integrated interconnect 102 is still visible through the openings 602 which are being closed off by growth.

Figure 8:
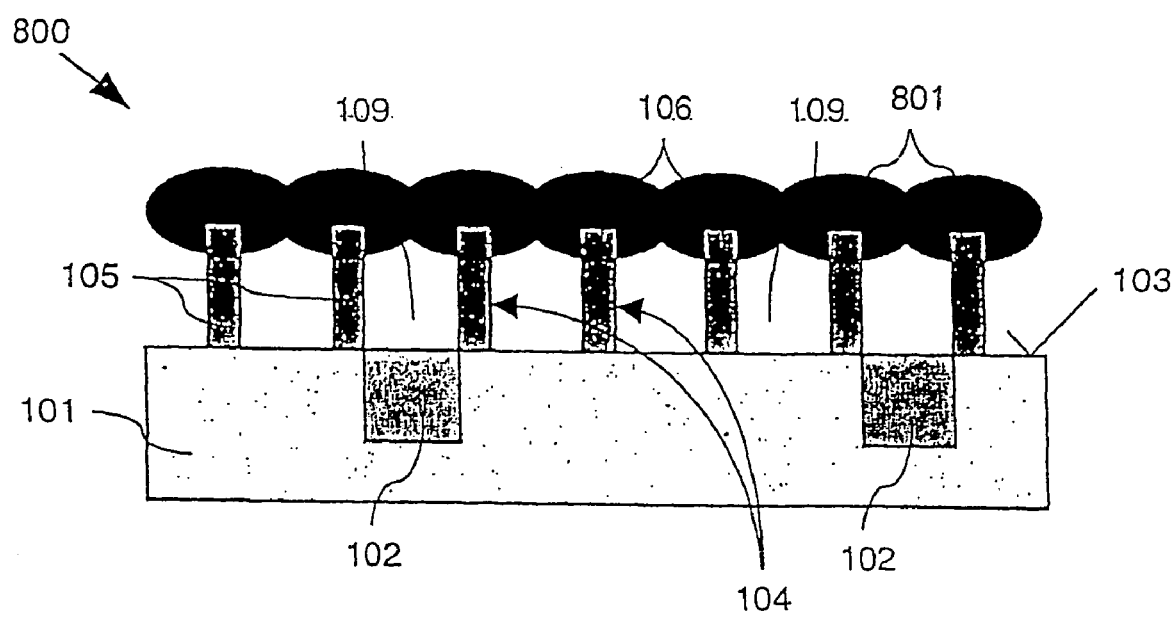
FIG. 8 shows a cross section through an as yet incomplete pattern of voids in accordance with FIG. 1 at a fourth time during the execution of the production method in accordance with the exemplary embodiment of the invention.

FIG. 8 shows a cross section through an as yet incomplete pattern of voids 800 at a fourth time during the execution of the production method in accordance with the exemplary embodiment of the invention.

As has already been described in connection with FIG. 6, third isolation material ($SiO_2$) is still being selectively deposited at the beads 601, with the result that a layer of beads 801 which have grown together is formed above the third layer 106. The layer of beads 801 which have grown together does not have a planar surface parallel to the first layer surface 103 but does completely cover the spaces 401. Therefore, the spaces 401 form voids 109 between the first layer surface 103, the adjacent lands 104 and the layer of beads 801 which have grown together.

Figure 9:
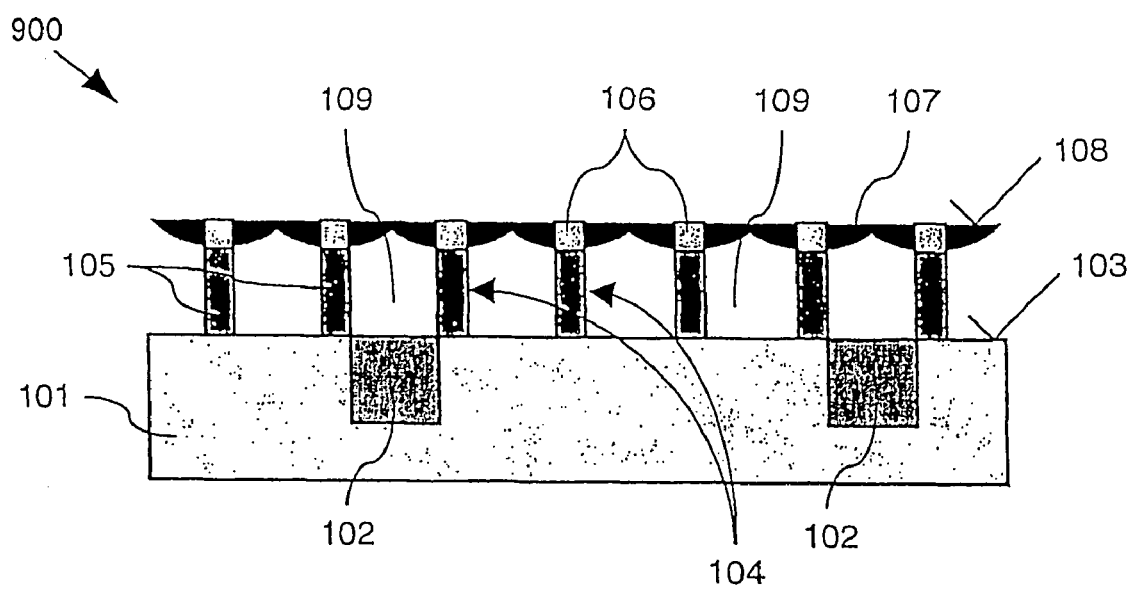
FIG. 9 shows a cross section through an as yet incomplete pattern of voids in accordance with FIG. 1 at a fifth time during the execution of the production method in accordance with the exemplary embodiment of the invention.

FIG. 9 shows a cross section through an as yet incomplete pattern of voids 900 at a fifth time during the execution of the production method in accordance with the exemplary embodiment of the invention.

The layer of beads 801 which have grown together is abraded by means of a chemical-mechanical polishing operation in such a manner that the adjacent lands 104 are uncovered again at their top edges and a planar surface parallel to the first layer surface 103 is formed. This planar surface is identical to the second layer surface 108. Therefore, the fourth layer 107 is formed from the layer of beads 801 which have grown together. Consequently, the second layer surface 108 delimits the third layer 106 and the fourth layer 107 parallel to the first layer surface 103.

Figure 10:
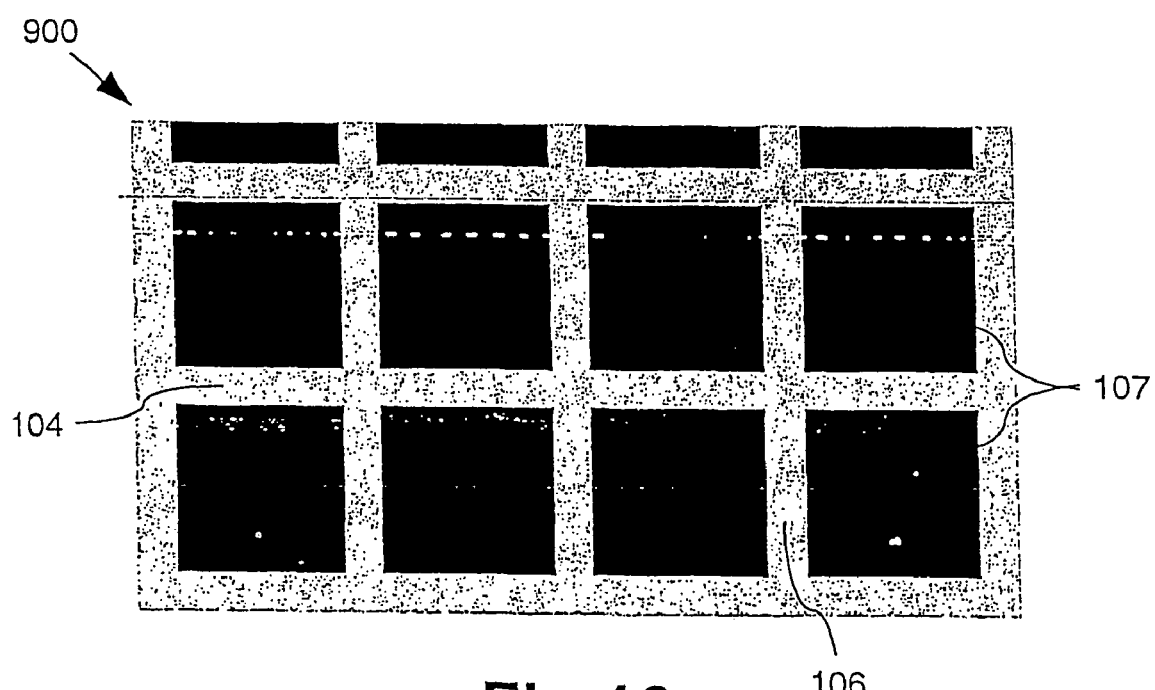
FIG. 10 shows a plan view of the pattern of voids from FIG. 9.

FIG. 10 shows a plan view of the pattern of voids 100 from FIG. 9. The voids 109 between the adjacent lands 104 are completely closed off by means of the fourth layer 107. Thus, only the third layer 106 and the fourth layer 107 are still uncovered, the fourth layer 107, on account of the selected grid structure, being divided into a plurality of partial regions which are square in plan view.

Figure 11:
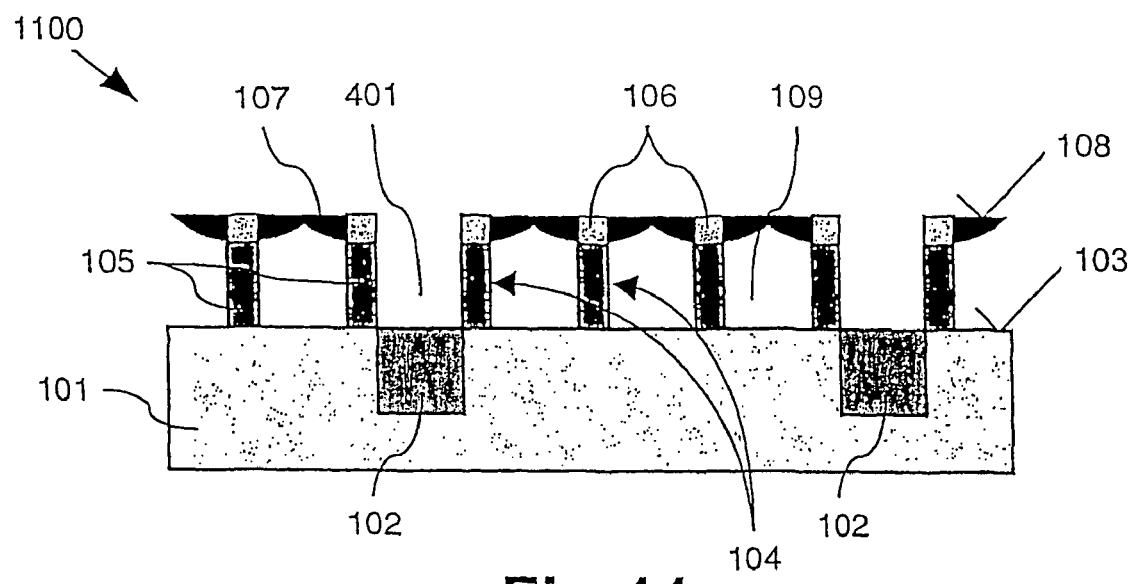
FIG. 11 shows a cross section through an as yet incomplete pattern of voids in accordance with FIG. 1 at a sixth time during the execution of the production method in accordance with the exemplary embodiment of the invention.

FIG. 11 shows a cross section through an as yet incomplete pattern of voids 1100 at a sixth time during the execution of the production method in accordance with the exemplary embodiment of the invention.

The fourth layer 107 is uncovered again above some voids 109 by means of further lithography and a further etch, with the result that the spaces 401 between adjacent lands 104 are completely opened up again at that location.

It is preferable for the opened, i.e. uncovered, spaces 401 to be formed at selected locations above the interconnects 102 if electrical contact is to be made with interconnects 102 at the first layer surface 103 from the second layer surface 108.

To produce the electrical contacts 110, the spaces 401 which have been opened up are filled with electrically conductive material until the electrically conductive material is flush with the second layer surface 108. The spaces 401 which have been opened up are preferably filled with electrically conductive material by means of a conventional metallization process. This then results in the pattern of voids 100 illustrated in FIG. 1.

By way of example, it may be necessary to produce electrical contacts 110 if further metallization levels for signal processing or signal transfer are provided above the pattern of voids 100 according to the invention.

Figure 12:
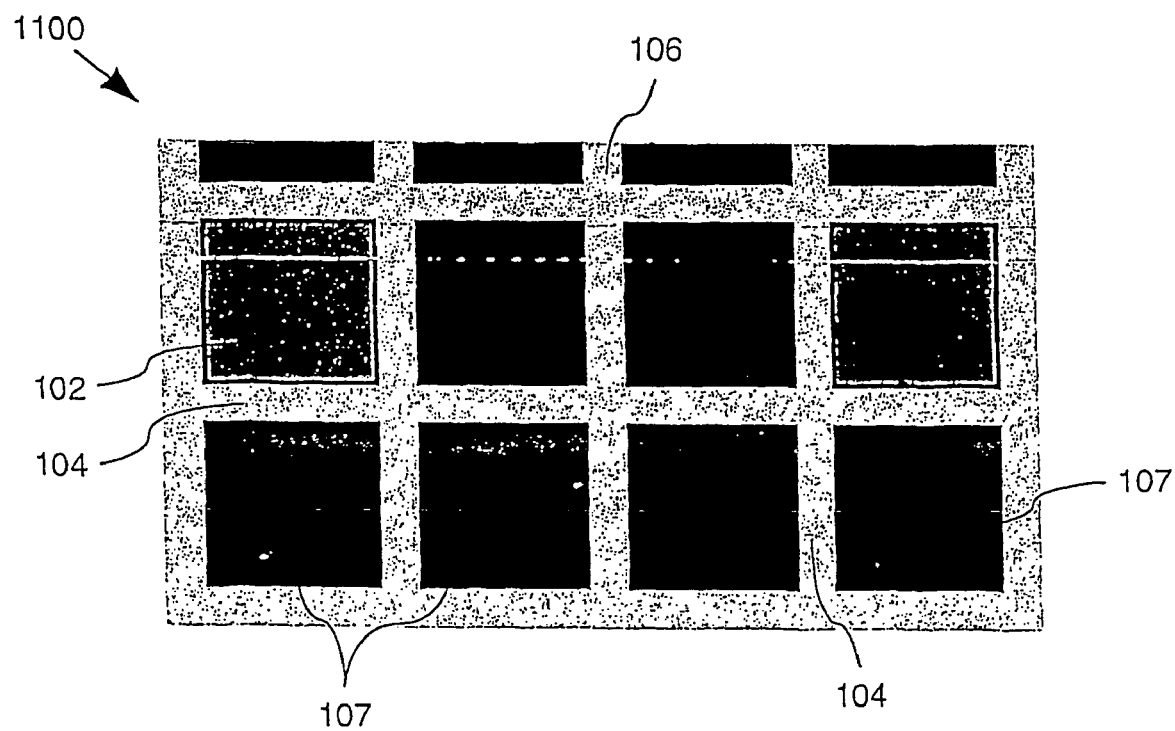
FIG. 12 shows a plan view of the pattern of voids from FIG. 11.

FIG. 12 shows a plan view of the pattern of voids 1100 from FIG. 11. This plan view differs from the plan view shown in FIG. 10 by virtue of the fact that the fourth layer 107 is no longer present between some adjacent lands 104, and therefore the interconnects 102 arranged at the first layer surface 103 are visible.

Figure 13:
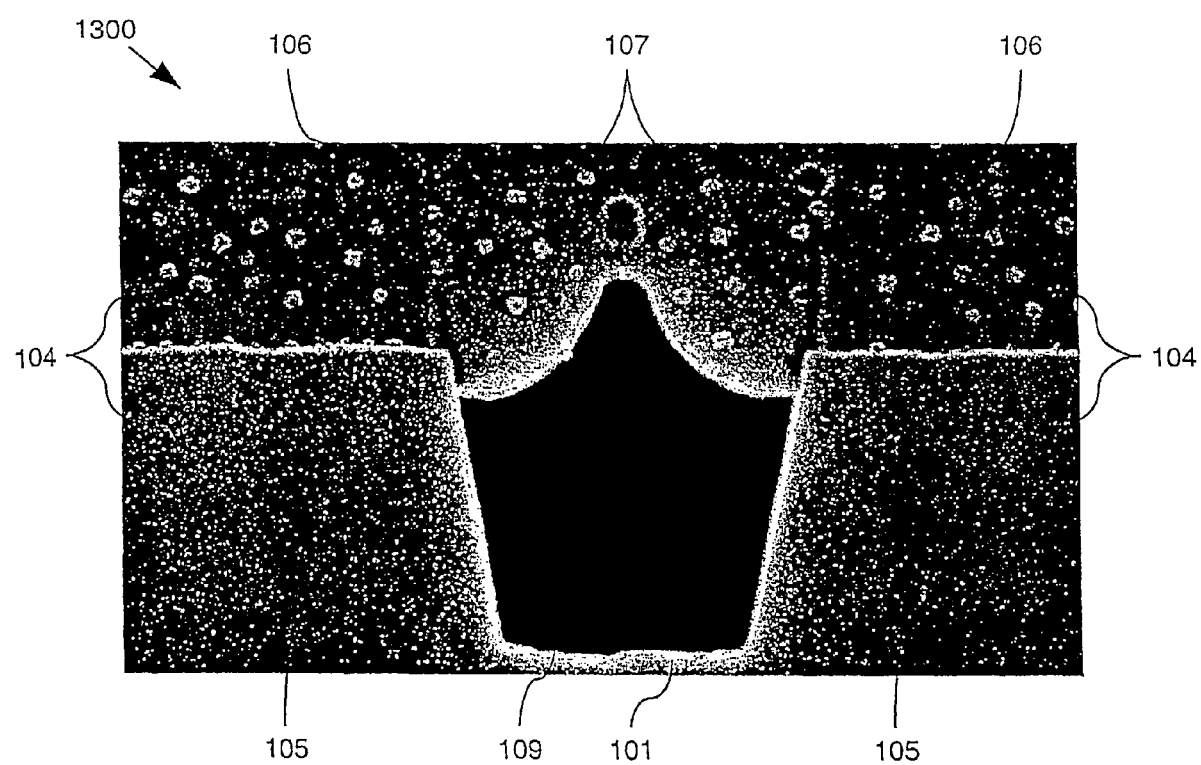
FIG. 13 shows an enlarged detail from the cross section through the pattern of voids from FIG. 1.

FIG. 13 shows an enlarged detail from the cross section through the pattern of voids 100 shown in FIG. 1. This figure illustrates the adjacent lands 104, which include the second layer 105 and the third layer 106 and are applied to the first layer 101. Between the adjacent lands 104, the fourth layer 107, which together with the first layer 101 and the adjacent lands 104 encloses the void 109, is arranged selectively on the third layer 106. The shape of the fourth layer 107 covering the void 109 also reveals the shape of the beads 601 formed during the formation of the fourth layer 107.

The invention claimed is:

1. A pattern of voids in an integrated circuit, comprising:
 a first layer, a first layer surface and adjacent lands on the first layer surface, the adjacent lands enclosing spaces and including a second layer of a first isolation material and a third layer of a second isolation material arranged only on the second layer; and
 a fourth layer of a third isolation material which closes off at least some of the spaces, the third isolation material being selectively depositable only on the second isolation material and being not depositable on the first Isolation material;
 a surface of the fourth layer together with a surface of the third layer form a second layer surface parallel to the first layer surface, wherein the fourth layer and the third layer form a junction that is not parallel to the first layer surface; and
 wherein spaces which are not closed off by means of the fourth layer are filled with electrically conductive material.

2. The pattern of voids as claimed in claim 1, in which the spaces which are closed off form voids between the adjacent lands, the first layer surface and the fourth layer.

3. The pattern of voids as claimed in claim 2, in which the voids are provided for the purpose of electrical isolation between the first layer surface and the second layer surface.

4. The pattern of voids as claimed in claim 1, in which the first layer surface is partially electrically conductive.

5. The pattern of voids as claimed in claim 1, in which the spaces filled with electrically conductive material are provided as contacts between the first layer surface and the second layer surface.

6. The pattern of voids as claimed in claim 1, in which the voids are provided for the purpose of electrical isolation between contacts in different spaces.

7. The pattern of voids as claimed in claim 1, in which the adjacent lands are arranged in grid form.

8. The pattern of voids as claimed in claim 1, in which the adjacent lands and spaces form a planar pattern of voids with a planar second layer surface, and a plurality of these planar patterns of voids are arranged above one another.

9. The pattern of voids as claimed in claim 1, wherein the first isolation material of the second layer comprises silicon nitride, and the second isolation material of the third layer comprises plasma-enhanced silicon dioxide based on ozone-activated tetraethyl orthosilicate.

* * * * *